(12) United States Patent
Gottwald

(10) Patent No.: US 11,251,360 B2
(45) Date of Patent: Feb. 15, 2022

(54) MTJ CAPPING LAYER STRUCTURE FOR IMPROVED WRITE ERROR RATE SLOPES AND THERMAL STABILITY

(71) Applicant: International Business Machines Corporation, Armonk, NY (US)

(72) Inventor: Matthias Georg Gottwald, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 16/783,920

(22) Filed: Feb. 6, 2020

(65) Prior Publication Data

US 2021/0249588 A1    Aug. 12, 2021

(51) Int. Cl.
*H01L 43/02* (2006.01)
*G11C 11/16* (2006.01)
*H01L 27/22* (2006.01)

(52) U.S. Cl.
CPC .......... *H01L 43/02* (2013.01); *G11C 11/161* (2013.01); *G11C 11/1675* (2013.01); *H01L 27/222* (2013.01)

(58) Field of Classification Search
CPC ..... H01L 43/02; H01L 27/222; G11C 11/161; G11C 11/1675
USPC ........................................................ 257/421
See application file for complete search history.

(56) References Cited

U.S. PATENT DOCUMENTS

| | | | |
|---|---|---|---|
| 8,129,268 B2 | 3/2012 | Breitwisch | |
| 8,735,179 B2 | 5/2014 | Li et al. | |
| 8,958,180 B1 | 2/2015 | Park et al. | |
| 8,981,505 B2 | 3/2015 | Moriyama et al. | |
| 9,406,875 B2 | 8/2016 | Li et al. | |
| 9,444,035 B2 | 9/2016 | Park et al. | |
| 9,691,967 B2 | 6/2017 | Kim et al. | |
| 2008/0293165 A1* | 11/2008 | Ran | G11C 11/16 438/3 |
| 2014/0151827 A1 | 6/2014 | Zhou et al. | |
| 2014/0175581 A1 | 6/2014 | Guo | |

(Continued)

FOREIGN PATENT DOCUMENTS

| | | |
|---|---|---|
| CN | 103907156 A | 7/2014 |
| CN | 109755382 A | 5/2019 |
| CN | 110061029 A | 7/2019 |

OTHER PUBLICATIONS

International Search Report dated Mar. 30, 2021, received in a corresponding foreign application, 8 pages.

(Continued)

*Primary Examiner* — Jami Valentine Miller
(74) *Attorney, Agent, or Firm* — Scully, Scott, Murphy & Presser, P.C.; Daniel P. Morris, Esq.

(57) ABSTRACT

A magnetic tunnel junction (MTJ) stack structure having an enhanced write performance and thermal stability (i.e., retention) is provided which can be used as an element/component of a spin-transfer torque (STT) MRAM device. The improved write performance, particularly the write error rate slope as a function of write voltage (Vfrc) which is essential in defining the overdrive voltage needed to successfully write a bit at low write error floors, is provided by a MTJ stack structure in which a zirconium (Zr) cap layer is inserted between a MTJ capping layer and an etch stop layer.

18 Claims, 5 Drawing Sheets

(56) References Cited

U.S. PATENT DOCUMENTS

| | | | |
|---|---|---|---|
| 2015/0069544 A1* | 3/2015 | Nagamine | H01L 43/10 |
| | | | 257/421 |
| 2016/0225425 A1 | 8/2016 | Kim et al. | |
| 2017/0263680 A1 | 9/2017 | Yoshino et al. | |
| 2017/0294576 A1* | 10/2017 | Huang | H01L 43/08 |
| 2018/0033957 A1* | 2/2018 | Zhang | H01L 43/12 |
| 2019/0019944 A1 | 1/2019 | Sato et al. | |
| 2020/0365653 A1* | 11/2020 | Tsai | H01L 43/02 |
| 2021/0143324 A1* | 5/2021 | Lin | H01F 41/34 |

OTHER PUBLICATIONS

Sun, J. Z., et al., "Size dependence of spin-torque induced magnetic switching in CoFeB-based perpendicular magnetization tunnel junctions (invited)", Journal of Applied Physics 111, published online Mar. 7, 2012, pp. 07C711-1 to 07C711-3.

* cited by examiner

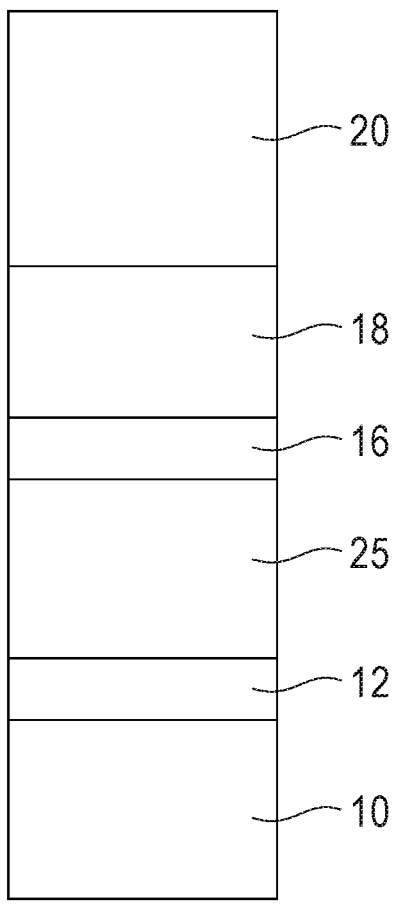
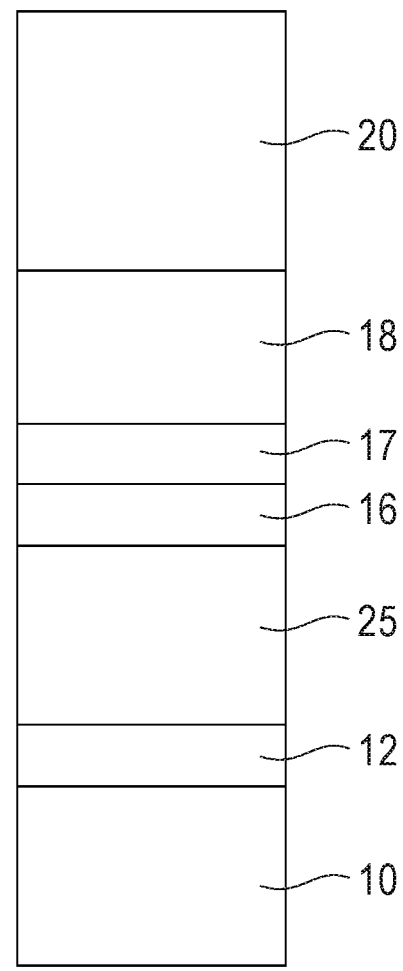
FIG. 3A
(PRIOR ART)
FIG. 3B
(PRIOR ART)

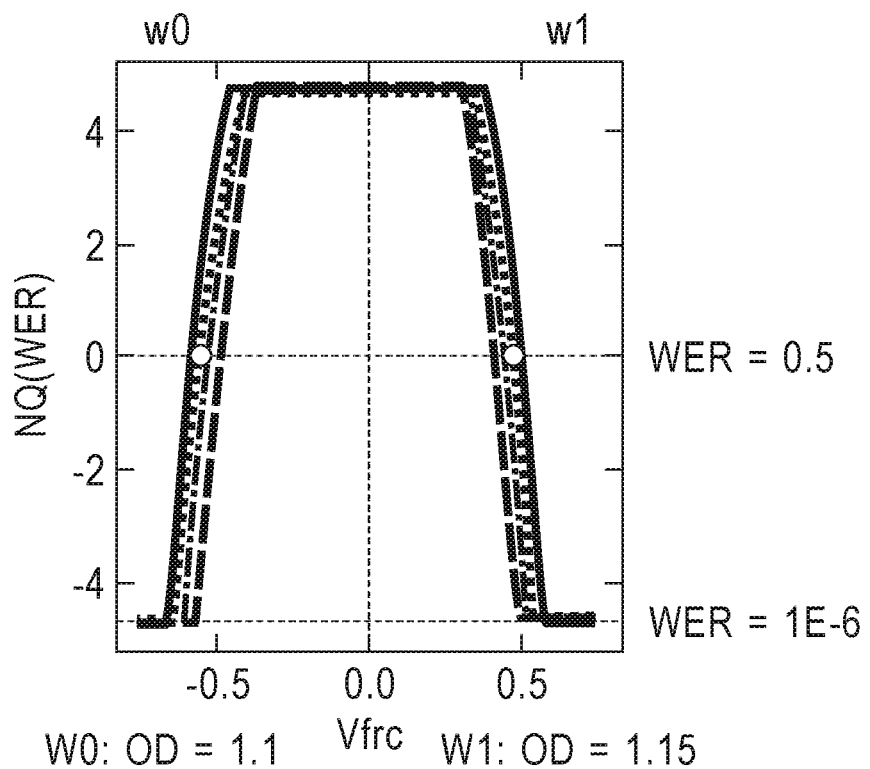
FIG. 7 (CE)
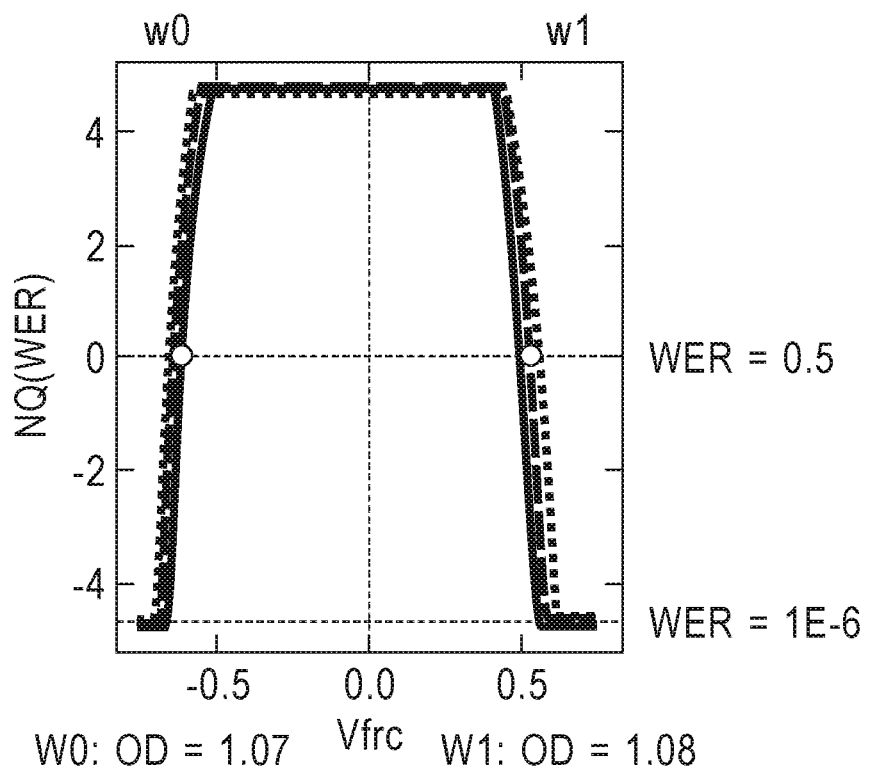
FIG. 8

MTJ CAPPING LAYER STRUCTURE FOR IMPROVED WRITE ERROR RATE SLOPES AND THERMAL STABILITY

BACKGROUND

The present application relates to magnetoresistive random access memory (MRAM). More particularly, the present application relates to a magnetic tunnel junction (MTJ) stack structure having enhanced write performance and thermal stability which can be used in a spin-transfer torque (STT) MRAM device.

STT MRAM uses a 2-terminal device as is shown, for example, in FIG. 1, that includes a bottom pinned MTJ stack that contains a magnetic pinned (or reference) layer 10, a tunnel barrier layer 12, and a magnetic free layer 14. A MTJ capping layer 16 is typically present on the magnetic free layer 14 of the bottom pinned MTJ stack. In the drawing, the arrow within the magnetic pinned layer 10 shows a possible orientation of that layer and the double headed arrow in the magnetic free layer 14 illustrate that the orientation in that layer can be switched.

In the bottom pinned MTJ stack shown in FIG. 1, the magnetization of the magnetic pinned layer 10 is fixed in one direction (say pointing up) and a current passed down through the junction makes the magnetic free layer 14 parallel to the magnetic pinned layer 10, while a current passed up through the junction makes the magnetic free layer 14 anti-parallel to the magnetic pinned layer 10. A smaller current (of either polarity) is used to read the resistance of the device, which depends on the relative orientations of the magnetizations of the magnetic free layer 14 and the magnetic pinned layer 10. The resistance is typically higher when the magnetizations are anti-parallel, and lower when they are parallel (though this can be reversed, depending on the material).

FIG. 1 illustrates a bottom pinned MTJ stack in which the magnetic free layer 14 is composed of at least one magnetic material with a magnetization that can be changed in orientation relative to the magnetization orientation of the magnetic pinned layer 10. FIGS. 2A and 2B illustrate different types of magnetic free layer structures 14S that can replace the magnetic free layer 14 employed in the bottom pinned MTJ stack shown in FIG. 1. Notably, FIG. 2A illustrates a magnetic free layer structure 14S that is composed of a first magnetic layer 14A and a second magnetic layer 14B that are spaced apart from each other by a non-magnetic dilution material 15A, while FIG. 2B illustrates a magnetic free layer structure 14S that is composed of a first magnetic layer 14A and a second magnetic layer 14B that are spaced apart from each other by a non-magnetic dilution material that contains an oxide for additional magnetic anisotropy (the non-magnetic dilution material that contains an oxide for additional magnetic anisotropy is designated as element 15B in the drawing figure).

It is also well established for the integration of STT MRAM devices into a back-end-of-the-line (BEOL) structure that a hard mask made from a nitride (e.g., tantalum nitride, TaN) or a metal with a lower etch rate as compared to typical magnetic MRAM materials is used. Below this hard mask there is typically an etch stop layer composed of a metal such as, for example, ruthenium (Ru), that has a higher etch rate compared to the hard mask which prevents the MTJ stack from being exposed to the etchant materials used to pattern the hard mask. FIG. 3A illustrates a prior art MTJ stack structure including, from bottom to top, a magnetic pinned layer 10, a tunnel barrier layer 12, a magnetic material-containing structure 25, a MTJ capping layer 16, an etch stop layer 18, and a hard mask 20. The magnetic material-containing structure 25 can include magnetic free layer 14 or one of the magnetic free layer structures 14S shown in FIGS. 2A-2B.

Further, and as is shown in FIG. 3B, it is also established to provide a MTJ stack structure in which a thin, less than 5 nm, oxide optimizing layer 17 is inserted between the etch stop layer 18 and the MTJ capping layer 16 to reduce strain from the hard mask 20 on the MRAM devices. The magnetic material-containing structure 25 for the MTJ stack structure shown in FIG. 3B can include magnetic free layer 14 or one of the magnetic free layer structures 14S shown in FIGS. 2A-2B.

Despite the numerous prior art MTJ stack structures known in the art, there is a need to provide a MTJ stack structure that has enhanced write performance and thermal stability.

SUMMARY

A magnetic tunnel junction (MTJ) stack structure having an enhanced write performance and thermal stability (i.e., retention) is provided which can be used as an element/component of a spin-transfer torque (STT) MRAM device. The improved write performance, particularly the write error rate slope as a function of write voltage (Vfrc) which is essential in defining the overdrive voltage needed to successfully write a bit at low write error floors, is provided by a MTJ stack structure in which a zirconium (Zr) cap layer is inserted between a MTJ capping layer and an etch stop layer.

In one aspect of the present application, a MTJ stack structure having an enhanced write performance and thermal stability (i.e., retention) is provided. In one embodiment, the MTJ stack structure includes a tunnel barrier layer located on a magnetic pinned layer, a magnetic material-containing structure located on the tunnel barrier layer, a MTJ capping layer located on the magnetic material-containing structure, a zirconium cap layer located above the MTJ capping layer, an etch stop layer located on the zirconium cap layer, wherein the etch stop layer has an interface with the zirconium cap layer, and a hard mask located on the etch stop layer.

In the present application, the term "magnetic material-containing structure" denotes a magnetic free layer that includes at least one magnetic material with a magnetization that can be changed in orientation relative to a magnetization orientation of the magnetic pinned layer, or a magnetic free layer structure that includes a first magnetic layer and a second magnetic layer that are spaced apart from each other by a non-magnetic dilution material, wherein the non-magnetic dilution material can further include an oxide for additional magnetic anisotropy.

In another embodiment of the present application, the MTJ stack structure includes a tunnel barrier layer located on a magnetic pinned layer, a magnetic free structure located on the tunnel barrier layer, wherein the magnetic free layer structure includes a first magnetic layer and a second magnetic layer that are spaced apart from each other by a non-magnetic dilution material that includes an oxide for additional magnetic anisotropy, a MTJ capping layer located on the second magnetic layer of the magnetic free layer structure, an oxide optimizing layer located on the MTJ capping layer, a zirconium cap layer located on the oxide optimizing layer, an etch stop layer located on the zirconium cap layer, and a hard mask located on the etch stop layer.

In another aspect of the present application, a STT MRAM device is provided. In one embodiment, the STT MRAM device includes a MTJ stack structure located on a surface of a bottom electrode. In one embodiment, the MTJ stack structure includes a tunnel barrier layer located on a magnetic pinned layer, a magnetic material-containing structure located on the tunnel barrier layer, a MTJ capping layer located on the magnetic material-containing structure, a zirconium cap layer located above the MTJ capping layer, an etch stop layer located on the zirconium cap layer, wherein the etch stop layer has an interface with the zirconium cap layer, and a hard mask located on the etch stop layer.

BRIEF DESCRIPTION OF THE DRAWINGS

FIG. 3A is a cross sectional view of a prior art MTJ stack structure that includes, from bottom to top, a magnetic pinned layer, a tunnel barrier layer, a magnetic material-containing structure, a MTJ capping layer, an etch stop layer and a hard mask.

FIG. 3B is a cross sectional view of a prior art MTJ stack structure that includes, from bottom to top, a magnetic pinned layer, a tunnel barrier layer, a magnetic material-containing structure, a MTJ capping layer, an oxide optimizing layer, an etch stop layer and a hard mask.

FIG. 7 is a graph showing the write error rate slope as a function of write voltage (Vfrc) for a prior art MTJ stack structure (CE).

FIG. 8 is a graph showing the write error rate slope as a function of write voltage (Vfrc) for an inventive MTJ stack structure (Inventive).

DETAILED DESCRIPTION

Figure 1:
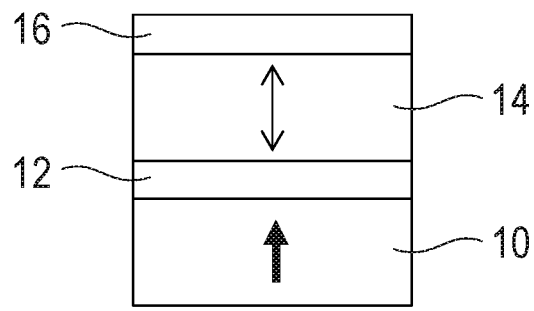
FIG. 1 is a cross sectional view of a prior art MTJ stack including, from bottom to top, a magnetic pinned (or reference) layer, a tunnel barrier layer, a magnetic free layer, and a MTJ capping layer.
Figure 2A:
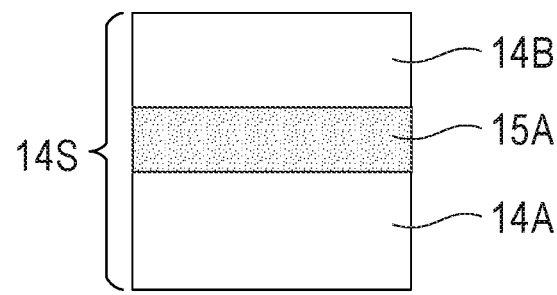
FIG. 2A is a cross sectional view of a prior art magnetic free layer structure that can be used in place of the magnetic free layer shown in FIG. 1, wherein the magnetic free layer structure includes a first magnetic layer and a second magnetic layer that are spaced apart from each other by non-magnetic dilution material.
Figure 2B:
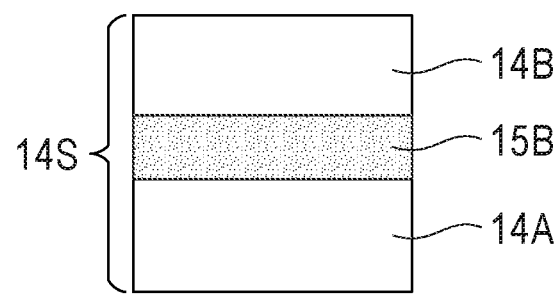
FIG. 2B is a cross sectional view of a prior art magnetic free layer structure that can be used in place of the magnetic free layer shown in FIG. 1, wherein the magnetic free layer structure includes a first magnetic layer and a second magnetic layer that are spaced apart from each other by non-magnetic dilution material that contains an oxide for additional magnetic anisotropy.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a MTJ stack structure in which a zirconium cap layer is formed between a MTJ capping layer and an etch stop layer. The presence of the zirconium cap layer between the MTJ capping layer and the etch stop layer was found by the Applicant to unexpectedly improve the write performance, particularly the write error rate slope as a function of write voltage (Vfrc) which is essential in defining the overdrive voltage needed to successfully write a bit at low write error floors, of the MTJ stack structure. Enhanced thermal stability as well as enhanced TMR can also be obtained using the MTJ stack structure of the present application. The MTJ stack structures of the present application are illustrated, for example, in FIGS. 4A and 4B of the present application.

Figure 4A:
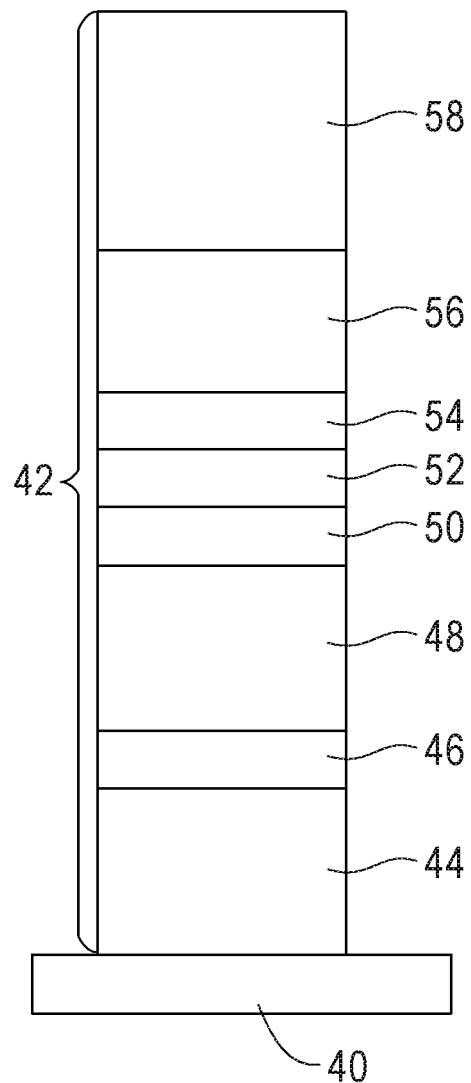
FIG. 4A is a cross sectional view of a MTJ stack structure in accordance with one embodiment of the present application and located on a bottom electrode, wherein the MTJ stack structure includes, from bottom to top, a magnetic pinned layer, a tunnel barrier layer, a magnetic free layer, a MTJ capping layer, an oxide optimizing layer, a zirconium cap layer, an etch stop layer and a hard mask.

Referring first to FIG. 4A, there is illustrated a MTJ stack structure 42 in accordance with one embodiment of the present application and located on a bottom electrode 40; collectively the MTJ stack structure 42 and the bottom electrode 40 provide elements/components of a STT MRAM device. In the illustrated embodiment shown in FIG. 4A, the MTJ stack structure 42 includes, from bottom to top, a magnetic pinned layer 44, a tunnel barrier layer 46, a magnetic free layer 48, a MTJ capping layer 50, an oxide optimizing layer 52, a zirconium cap layer 54, an etch stop layer 56 and a hard mask. 58. In some embodiments, the oxide optimizing layer 52 can be omitted for the MTJ stack structure 42.

Figure 4B:
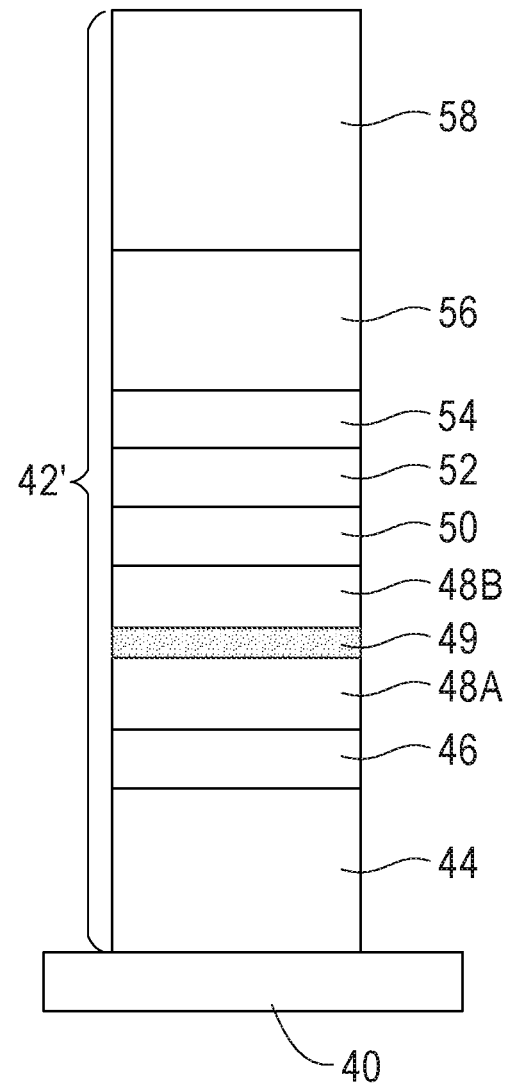
FIG. 4B is a cross sectional view of a MTJ stack structure in accordance with another embodiment of the present application and located on a bottom electrode, wherein the MTJ stack structure include, from bottom to top, a magnetic pinned layer, a tunnel barrier layer, a magnetic free layer structure, a MTJ capping layer, an oxide optimizing layer, a zirconium cap layer, an etch stop layer and a hard mask.

Referring now to FIG. 4B, there is a MTJ stack structure 42' in accordance with another embodiment of the present application and located on a bottom electrode 40; collectively the MTJ stack structure 42' and the bottom electrode 40 provide elements/components of a STT MRAM device. In the illustrated embodiment shown in FIG. 4B, the MTJ stack structure 42' includes, from bottom to top, a magnetic pinned layer 44, a tunnel barrier layer 46, a magnetic free layer structure (48A/49/48B), a MTJ capping layer 50, an oxide optimizing layer 52, a zirconium cap layer 54, an etch stop layer 56 and a hard mask. 58. In some embodiments, the oxide optimizing layer 52 can be omitted for the MTJ stack structure 42'.

In the various embodiments of the present application, the magnetic pinned layer 44, the tunnel barrier layer 46, and magnetic material-containing structure (i.e., magnetic free layer 48 or magnetic free layer structure (48A/49/48B)) collectively provide a MTJ structure. Also, and in the various embodiments of the present application, the MTJ capping layer 50, the zirconium cap layer 54, and, if present, the oxide optimizing layer 52 provide a MTJ capping layer structure that provides improved write error rate slopes, thermal stability and TMR to a STT MRAM device that contains the same; the improvement is facilitated by the zirconium cap layer 54 which is located between the MTJ capping layer 50 and the etch stop layer 56.

As is shown in the various embodiments depicted in FIG. 4A-4B, the zirconium cap layer 54 forms an interface with the etch stop layer 56. In some embodiments, and when the oxide optimizing layer 52 is present, the zirconium cap layer 54 forms another interface with the oxide optimizing layer 52. Also, and in embodiments in which the oxide optimizing layer 52 is present, the oxide optimizing layer 52 forms a first interface with the MTJ capping layer 50 and a second interface with the zirconium cap layer 54. In other embodiments, and when the oxide optimizing layer 52 is not present, the zirconium cap layer 54 forms another interface with the MTJ capping layer 50. In any of the embodiments of the present application, the zirconium cap layer 54 is outside the magnetic materials that provide either the magnetic free layer 48, or the magnetic free layer structure (48A/49/48B).

The various elements/components of the structures shown in FIGS. 4A-4B will now be described in greater detail. The bottom electrode 40 of the structures shown in FIGS. 4A-4B is typically located on a surface of an electrically conductive structure (not shown). The electrically conductive structure is embedded in an interconnect dielectric material layer (also not shown). Another interconnect dielectric material layer (not shown) may embed the MTJ stack structures (42, 42') illustrated in FIGS. 4A-4B. Another electrically conductive structure (not shown) can contact a surface of the hard mask 58, which typically functions as a top electrode of the MRAM device.

The bottom electrode 40 may be composed of an electrically conductive material such as, for example, an electrically conductive metal, an electrically conductive metal alloy, or an electrically conductive metal nitride. Examples of electrically conductive metals that can be used to provide the bottom electrode 40 include, but are not limited to, copper (Cu), ruthenium (Ru), cobalt (Co), rhodium (Rh), tungsten (W), aluminum (Al), tantalum (Ta) or titanium (Ti). An example of electrically conductive metal alloy that can be used to provide the bottom electrode 40 includes, but is not limited to, Cu—Al, and an example of electrically conductive metal nitride that can be used to provide the bottom electrode 40 includes, but is not limited to, TaN or TiN. The bottom electrode 40 can be formed utilizing techniques well known to those skilled in the art. The conductive material that provides the bottom electrode 40 can be formed utilizing a deposition process such as, for example, chemical vapor deposition (CVD), plasma enhanced chemical vapor deposition (PECVD), sputtering or plating. The bottom electrode 40 can have a thickness from 10 nm to 200 nm; although other thicknesses are possible and can be used as the thickness of the bottom electrode 40. The bottom electrode 40 can be formed on a recessed surface or a non-recessed surface of the electrically conductive structure (not shown).

The magnetic pinned layer 44 that is employed in the present application has a fixed magnetization; the magnetic pinned layer 44 can also be referred to as a magnetic reference layer. The magnetic pinned layer 44 can be composed of a metal or metal alloy that includes one or more metals exhibiting high spin polarization. In alternative embodiments, exemplary metals for the formation of the magnetic pinned layer 44 include iron, nickel, cobalt, chromium, boron, and manganese. Exemplary metal alloys may include the metals exemplified above (i.e., iron, nickel, cobalt, chromium, boron, and manganese). In another embodiment, the magnetic pinned layer 44 may be a multilayer arrangement having (1) a high spin polarization region formed from of a metal and/or metal alloy using the metals mentioned above (i.e., iron, nickel, cobalt, chromium, boron, and manganese), and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The magnetic pinned layer 44 that can be employed in the present application can have a thickness from 3 nm to 20 nm; although other thicknesses for the magnetic pinned layer 44 can be used.

The tunnel barrier layer 46 is composed of an insulator material and is formed at such a thickness as to provide an appropriate tunneling resistance. Exemplary materials for the tunnel barrier layer 46 include magnesium oxide, aluminum oxide, and titanium oxide, or materials of higher electrical tunnel conductance, such as semiconductors or low-bandgap insulators. In one embodiment, magnesium oxide is used as the material that provides the tunnel barrier layer 46. The thickness of tunnel barrier layer 46 can be from 0.5 nm to 1.5 nm; although other thicknesses for the tunnel barrier layer 46 can be used as long as the selected thickness provides a desired tunnel barrier resistance.

In the illustrated embodiment shown in FIG. 4A, the magnetic free layer 48 is composed of at least one magnetic material with a magnetization that can be changed in orientation relative to the magnetization orientation of the reference layer. Exemplary magnetic materials for the magnetic free layer 48 include alloys and/or multilayers of cobalt, iron, alloys of cobalt-iron, nickel, alloys of nickel-iron, and alloys of cobalt-iron-boron. The magnetic free layer 48 that can be employed in the present application can have a thickness from 1 nm to 3 nm; although other thicknesses for the magnetic free layer 48 can be used.

In the illustrated embodiment shown in FIG. 4B, the magnetic free layer structure (48A/49/48B) includes a first magnetic layer 48A and a second magnetic layer 48B that are spaced apart from each other by a non-magnetic dilution material 49, wherein the non-magnetic dilution material 49 can further include an oxide for additional magnetic anisotropy. The thicknesses of the materials used in non-magnetic dilution material 49 are chosen to be thin enough to provide strong co-linear magnetic exchange coupling between first magnetic layer 48A and the second magnetic layer 48B. "Strong" in this context means that the exchange coupling field keeping both first and second magnetic layers aligned is larger than 500 Oe.

The first magnetic layer 48A of the magnetic free layer structure (48A/49/48B) is composed of a first magnetic material with a magnetization that can be changed in orientation relative to the magnetization orientation of the magnetic pinned layer 44. Exemplary magnetic materials for the first magnetic layer 48A include alloys and/or multilayers of cobalt (Co), iron (Fe), alloys of cobalt-iron, nickel (Ni), alloys of nickel-iron, and alloys of cobalt-iron-boron (Co—Fe—B). The first magnetic layer 48A can have a thickness from 1 nm to 3 nm, although other thicknesses can be used as the thickness of the first magnetic layer 48A.

The non-magnetic dilution material 49 is composed of a non-magnetic material such as, for example, tantalum (Ta), tungsten (W), molybdenum (Mo), niobium (Nb) or zirconium (Zr). In such embodiments, the non-magnetic dilution material 49 can include an oxide material such as magnesium oxide, for providing stronger magnetic anisotropy to the magnetic free layer structure (48A/49/48B). The non-magnetic dilution material 49 can have a thickness from 0.2 nm to 1.2 nm.

The second magnetic layer 48B of the magnetic free layer structure (48A/49/48B) is composed of a second magnetic material. The second magnetic material that provides the second magnetic layer 48B can include one of the magnetic materials mentioned above for the first magnetic layer 48A. The second magnetic material that provides the second magnetic layer 48B can be the same or different from the first magnetic material that provides the first magnetic layer 48A. The second magnetic layer 48A can have a thickness from 0.3 nm to 3 nm, although other thicknesses can be used as the thickness of the second magnetic layer 48B.

The MTJ capping layer 50 is present on either the magnetic free layer 48 shown in FIG. 4A or on the second magnetic layer 48B of the magnetic free layer structure (48A/49/48B) shown in FIG. 4B. The MTJ capping layer 50 thus forms an interface with either the magnetic free layer 48 shown in FIG. 4A, or with the second magnetic layer 48B of the magnetic free layer structure (48A/49/48B). The MTJ capping layer 50 is preferentially composed of magnesium oxide (MgO). Other materials for the MTJ capping layer 50 include aluminum oxide ($Al_2O_3$), calcium oxide (CaO), tantalum oxide ($Ta_2O_5$), niobium oxide ($Nb_2O_5$) or ternary oxides such as, for example, $Mg_yTi_{(1-y)}O_x$. The MTJ capping layer 50 can have a thickness from 0.3 nm to 2 nm; other thicknesses are possible and can be used in the present application as the thickness of the MTJ capping layer 50.

The optional oxide optimizing layer 52 includes a magnetic material that modifies the properties (i.e., crystal orientation) of the MTJ capping layer 50. In one embodiment, the optional oxide optimizing layer 52 is composed of a cobalt-iron-boron (Co—Fe—B) alloy. In another embodiment, the oxide optimizing layer 52 is composed of a bilayer of a cobalt-iron-boron (Co—Fe—B) alloy combined with tantalum (Ta), tantalum nitride (TaN) or tungsten (W). In either embodiment, the oxide optimizing layer 52 can have a thickness from 0.2 nm to 1 nm.

The zirconium (Zr) cap layer 54 is composed of unalloyed zirconium which can have a thickness from 0.5 nm to 4.0 nm. The presence of the zirconium cap layer 54 in the MTJ cap structure provides improved write error rate slopes and thermal stability to a MTJ stack structure that contains the same as compared to an equivalent MTJ stack structure in which a zirconium caps layer is not present in the MTJ cap structure.

The etch stop layer 56 is composed of a metal, other than zirconium (Zr), such as, for example, ruthenium (Ru) or iridium (Ir) that has a higher etch rate compared to the hard mask 58 which prevents the MTJ stack structure from being exposed to the etchant materials used to pattern the hard mask 58. The etch stop layer 56 can have a thickness from 5.0 nm to 30 nm; although other thicknesses for the etch stop layer 56 can be used in the present application.

The hard mask 58 can be composed of a metal nitride such as, for example, tantalum nitride (TaN) or titanium nitride (TiN) or a metal such as, for example, titanium (Ti) or tantalum (Ta), which is compositionally different from the material used to provide the etch stop layer 56. In some embodiments, the hard mask 58 can be employed as a top electrode of the STT MRAM device. In other embodiment, a separate top electrode (composed of one of the electrically conductive materials mentioned above for the bottom electrode 40) can be formed on the hard mask 58. The hard mask can have a thickness from 50 nm to 1500 nm; although other thicknesses for the hard mask 58 can be used in the present application.

The MTJ stack structure (42, 42') of the present application can be formed by deposition of the various material layers that provide the specific MTJ stack structure, followed by a patterning process such as, for example, lithography and etching. The MTJ stack structure (42, 42') of the present application can have a critical dimension (CD) that is less than or equal to, the critical dimension (CD) of the bottom electrode 40. The deposition of the various materials layers that provide the specific MTJ stack structure can be performed in a same deposition tool or different deposition tools. For example, the magnetic pinned layer 44, the tunnel barrier layer 46, the magnetic free layer 48 (or the magnetic free layer structure 48A/49/48B) can be deposited in a first deposition tool, and the MTJ capping layer 50, the optional oxide optimizing layer 52, and the zirconium cap layer 54, the etch stop layer 56 and the hard mask 58 can be deposited in a second deposition tool, which differs from the first deposition tool, and has deposition rates suitable for the deposition of those individual layers.

The various materials that provide the MTJ stack structure (42, 42') of the present application can be deposited by chemical vapor deposition (CVD), plasma enhanced chemical vapor deposition (PECVD), physical vapor deposition (PVD), atomic layer deposition (ALD) or sputtering. The various materials that provide the MTJ stack structure (42, 42') of the present application can be deposited utilizing the same or different deposition process.

Reference is now made to FIGS. 5, 6, 7 and 8, in which an inventive MTJ stack structure (Inventive) in accordance with an embodiment of the present application was compared to a comparative MTJ stack structure (CE). The inventive MTJ stack structure that was used in generating the data shown in FIGS. 5, 6 and 8 included a MTJ stack structure 42' as shown in FIG. 4B that included, from bottom to top, a magnetic pinned layer composed of a [Co|Pt] multilayer magnetically coupled to a CoFeB polarization enhancement layer, a tunnel barrier layer composed of magnesium oxide, a magnetic free layer structure composed of CoFeB (48A and 48B) with an anisotropy enhancing MgO insertion layer (49), a MTJ capping layer composed of magnesium oxide, an oxide optimizing layer composed of a Co—Fe—B alloy, a zirconium cap layer, an etch stop layer composed of Ru and a hard mask composed of TaN. The comparative MTJ stack structure (CE) that was used in generating the data shown in FIGS. 5, 6 and 7 was the same as the inventive MTJ stack structure except that no zirconium cap layer was formed between the Co—FE—B alloy oxide optimizing layer and the Ru etch stop layer.

Figure 5:
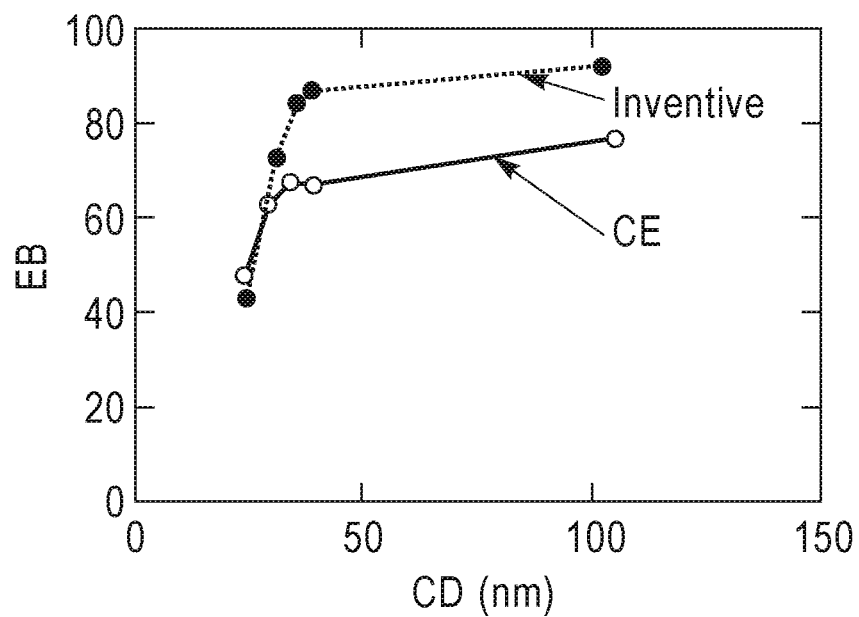
FIG. 5 is a graph of critical dimension (CD) vs. retention parameter (EB) of a prior art MTJ stack structure (CE) and an inventive MTJ stack structure (Inventive).

As can be seen from FIG. 5, the inventive MTJ stack structure (Inventive) of the present application that included the zirconium cap layer present between the Co—FE—B alloy oxide optimizing layer and the Ru etch stop layer exhibited improved retention as compared to the comparative MTJ stack structure (CE) in which no zirconium cap layer was formed between the Co—FE—B alloy oxide optimizing layer and the Ru etch stop layer. The retention data ($E_B$ in $k_BT$, with $k_B$ being the Boltzman constant (~1.38*1e-23 J/K) and T being room temperature (300K)) shown in FIG. 5 was obtained by measuring the thermal-activation-limited switching probability of 100 MTJ devices for each size (CD) (see, for example, J. Appl. Phys. 111, 07C711(2012), https://doi.org/10.1063/1.3677385). The plotted value is the mean value of the 100 tested devices per size. In the graph shown in FIG. 5, $E_B$ (measured in $k_BT$) is the retention parameter and CD (measured in nm) is the critical dimension, i.e., size, of the MTJ stack structure.

Figure 6:
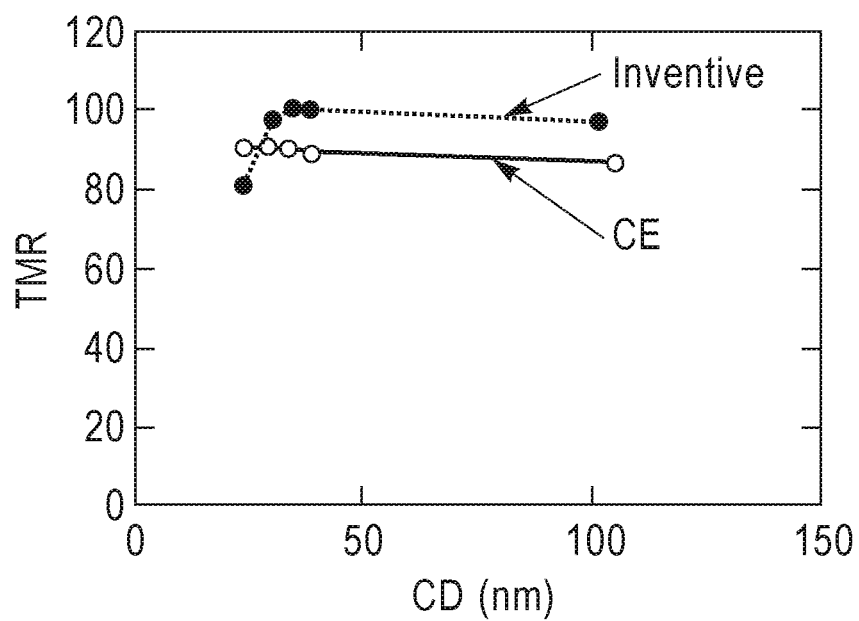
FIG. 6 is a graph of critical dimension (CD) vs. tunnel magnetoresistance (TMR) of a prior art MTJ stack structure (CE) and an inventive MTJ stack structure (Inventive).

As can be seen from FIG. 6, the inventive MTJ stack structure (Inventive) of the present application that included the zirconium cap layer present between the Co—FE—B alloy oxide optimizing layer and the Ru etch stop layer exhibited improved tunnel magnetoresistance (TMR) as compared to the comparative MTJ stack structure (CE) in which no zirconium cap layer was formed between the Co—FE—B alloy oxide optimizing layer and the Ru etch stop layer. The TMR data shown in FIG. 6 was obtained by measuring device resistance as a function of applied field (R vs H) with low voltage bias (20 mV) for a set of 100 MTJ devices for each CD. The plotted value is the mean value among these 100 devices per CD.

Reference is now made to FIGS. 7 and 8, as can be seen in those figures, the inventive MTJ stack structure (Inventive) that included the zirconium cap layer present between the Co—FE—B alloy oxide optimizing layer and the Ru etch stop layer exhibited an improved write error rate slope as a function of write voltage (Vfcr) as compared to the comparative MTJ stack structure (CE) in which no zirconium cap layer was formed between the Co—Fe—B alloy oxide optimizing layer and the Ru etch stop layer for short write pulses of 10 ns. A meaningful way to describe the write error rate slope is the so-called overdrive (OD). The overdrive (OD) is given as the ratio between the voltage needed for achieving a certain error floor (1E-6 in the given figures) divided by the voltage needed to achieve 50% switching probability. The write error rate as a function of write voltage (Vfcr) shown in FIGS. 7-8 was obtained by applying 1E6 pulses of 10 ns pulse width for each voltage from 0 V to 0.8V in steps of 0.02 V and dividing the number of unsuccessful attempts through the total number of switching attempts for each voltage. A successful write attempt in the case of W1 is when a pulse with a polarity to write the state 1 (high resistance state of the MTJ) is applied and the following measurement readout shows the actual state to be 1 (high resistance state). A successful write attempt in the case of W0 is when a pulse with a polarity to write the state 0 (low resistance state of the MTJ) is applied and the following measurement readout shows the actual state to be 0 (low resistance state). A switching error in the case of W1 is when a pulse with a polarity to write the state 1 (high resistance state of the MTJ) is applied and the following measurement readout shows the actual state to be 0 (low resistance state). A switching error in the case of W0 is when a pulse with a polarity to write the state 0 (low resistance state of the MTJ) is applied and the following measurement readout shows the actual state to be 1 (high resistance state).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated but fall within the scope of the appended claims.

What is claimed is:

1. A magnetic tunnel junction (MTJ) stack structure comprising:
    a tunnel barrier layer located on a magnetic pinned layer;
    a magnetic material-containing structure located on the tunnel barrier layer;
    a MTJ capping layer located on the magnetic material-containing structure;
    a zirconium cap layer composed of elemental zirconium and located entirely above the MTJ capping layer, wherein the zirconium cap layer is spaced apart from the magnetic material-containing structure by at least the MTJ capping layer;
    an oxide optimizing layer located between the MTJ capping layer and the zirconium cap layer, wherein the oxide optimizing layer forms a first interface with the MTJ capping layer and a second interface with the zirconium cap layer;
    an etch stop layer located on the zirconium cap layer, wherein the etch stop layer has an interface with the zirconium cap layer;
    a hard mask located on the etch stop layer.

2. The MTJ stack structure of claim 1, wherein the magnetic material-containing structure is a magnetic free layer that comprises at least one magnetic material with a magnetization that can be changed in orientation relative to a magnetization orientation of the magnetic pinned layer.

3. The MTJ stack structure of claim 1, wherein the magnetic material-containing structure is a magnetic free layer structure that comprises a first magnetic layer and a second magnetic layer that are spaced apart from each other by a non-magnetic dilution material.

4. The MTJ stack structure of claim 3, wherein the non-magnetic dilution material further includes an oxide for additional magnetic anisotropy.

5. The MTJ stack structure of claim 1, wherein the zirconium cap layer has a thickness from 0.5 nm to 4.0 nm.

6. The MTJ stack structure of claim 1, wherein the hard mask is composed of tantalum nitride, the etch stop layer is composed of ruthenium, and the MTJ capping layer is composed of magnesium oxide.

7. A magnetic tunnel junction (MTJ) stack structure comprising:
    a tunnel barrier layer located on a magnetic pinned layer;
    a magnetic free structure located on the tunnel barrier layer, wherein the magnetic free layer structure comprises a first magnetic layer and a second magnetic layer that are spaced apart from each other by a non-magnetic dilution material that includes an oxide for additional magnetic anisotropy;
    a MTJ capping layer located on the second magnetic layer of the magnetic free layer structure;

an oxide optimizing layer located on the MTJ capping layer;

a zirconium cap layer located on the oxide optimizing layer;

an etch stop layer located on the zirconium cap layer; and a hard mask located on the etch stop layer.

8. The MTJ stack structure of claim 7, wherein the hard mask is composed of tantalum nitride, the etch stop layer is composed of ruthenium, the oxide optimizing layer is composed of a cobalt-iron-boron alloy, and the MTJ capping layer is composed of magnesium oxide.

9. The MTJ stack structure of claim 7, wherein the zirconium cap layer has a thickness from 0.5 nm to 4.0 nm.

10. A spin-transfer torque magnetoresistive random access memory (STT MRAM) device comprising:

a magnetic tunnel junction (MTJ) stack structure located on a bottom electrode, wherein the MTJ stack structure comprises:

a tunnel barrier layer located on a magnetic pinned layer;

a magnetic material-containing structure located on the tunnel barrier layer;

a MTJ capping layer located on the magnetic material-containing structure;

a zirconium cap layer composed of elemental zirconium and located entirely above the MTJ capping layer, wherein the zirconium cap layer is spaced apart from the magnetic material-containing structure by at least the MTJ capping layer;

an oxide optimizing layer located between the MTJ capping layer and the zirconium cap layer, wherein the oxide optimizing layer forms a first interface with the MTJ capping layer and a second interface with the zirconium cap layer;

an etch stop layer located on the zirconium cap layer, wherein the etch stop layer has an interface with the zirconium cap layer; and a hard mask located on the etch stop layer.

11. The STT MRAM device of claim 10, wherein the magnetic material-containing structure is a magnetic free layer that comprises at least one magnetic material with a magnetization that can be changed in orientation relative to a magnetization orientation of the magnetic pinned layer.

12. The STT MRAM device of claim 10, wherein the magnetic material-containing structure is a magnetic free layer structure that comprises a first magnetic layer and a second magnetic layer that are spaced apart from each other by a non-magnetic dilution material.

13. The STT MRAM device of claim 12, wherein the non-magnetic dilution material further includes an oxide for additional magnetic anisotropy.

14. The STT MRAM device of claim 10, wherein the oxide optimizing layer is composed of a cobalt-iron-boron alloy or a bilayer of a cobalt-iron-boron alloy combined with tantalum, tantalum nitride or tungsten.

15. The STT MRAM device of claim 10, wherein the hard mask is composed of tantalum nitride, the etch stop is composed of ruthenium, the oxide optimizing layer is composed of a cobalt-iron-boron alloy, and the MTJ capping layer is composed of magnesium oxide.

16. The STT MRAM device of claim 10, wherein the zirconium cap layer has a thickness from 0.5 nm to 4.0 nm.

17. The STT MRAM device of claim 10, wherein the bottom electrode is composed of an electrically conductive metal, an electrically conductive metal alloy, or an electrically conductive metal nitride.

18. The STT MRAM device of claim 10, wherein the hard mask serves as a top electrode of the STT MRAM device.

* * * * *